US007881124B2

(12) United States Patent
Kari et al.

(10) Patent No.: US 7,881,124 B2
(45) Date of Patent: Feb. 1, 2011

(54) METHOD FOR BLOCK WRITING IN A MEMORY

(75) Inventors: Ahmed Kari, Aix en Provence (FR); Christophe Moreaux, Simiane (FR); David Naura, Aix en Provence (FR); Pierre Rizzo, Aix en Provence (FR)

(73) Assignee: STMicroelectronics SA, Montrouge (FR)

( * ) Notice: Subject to any disclaimer, the term of this patent is extended or adjusted under 35 U.S.C. 154(b) by 372 days.

(21) Appl. No.: 12/061,086

(22) Filed: Apr. 2, 2008

(65) Prior Publication Data

US 2009/0094410 A1   Apr. 9, 2009

Related U.S. Application Data

(63) Continuation of application No. PCT/FR2006/002137, filed on Sep. 19, 2006.

(51) Int. Cl.
*G11C 16/04* (2006.01)

(52) U.S. Cl. .................. 365/185.33; 365/189.011; 365/218; 365/230.03; 365/226

(58) Field of Classification Search ............ 365/185.33, 365/189.011, 218, 230.03, 226
See application file for complete search history.

(56) References Cited

U.S. PATENT DOCUMENTS

| 5,644,216 | A | * | 7/1997 | Lopez et al. | ................. 323/315 |
| 5,944,837 | A | * | 8/1999 | Talreja et al. | ................ 713/600 |
| 5,974,500 | A | * | 10/1999 | Maletsky et al. | ............ 711/103 |
| 2001/0021958 | A1 | | 9/2001 | ZInk et al. | |
| 2002/0118569 | A1 | | 8/2002 | Jeong et al. | |
| 2005/0024952 | A1 | | 2/2005 | Leconte et al. | |

* cited by examiner

*Primary Examiner*—Hoai V Ho
*Assistant Examiner*—Jason Lappas
(74) *Attorney, Agent, or Firm*—Lisa K. Jorgenson; Jeremiah J. Baunach; Seed IP Law Group PLLC

(57) ABSTRACT

A method is provided for block writing in an electrically programmable non-volatile memory, in which a block to be written in the memory includes at least one word. The method includes determining a word write time by dividing a fixed block write time by the number of words in the block to be written, and controlling the memory to successively write each word in the memory during the write time.

26 Claims, 4 Drawing Sheets

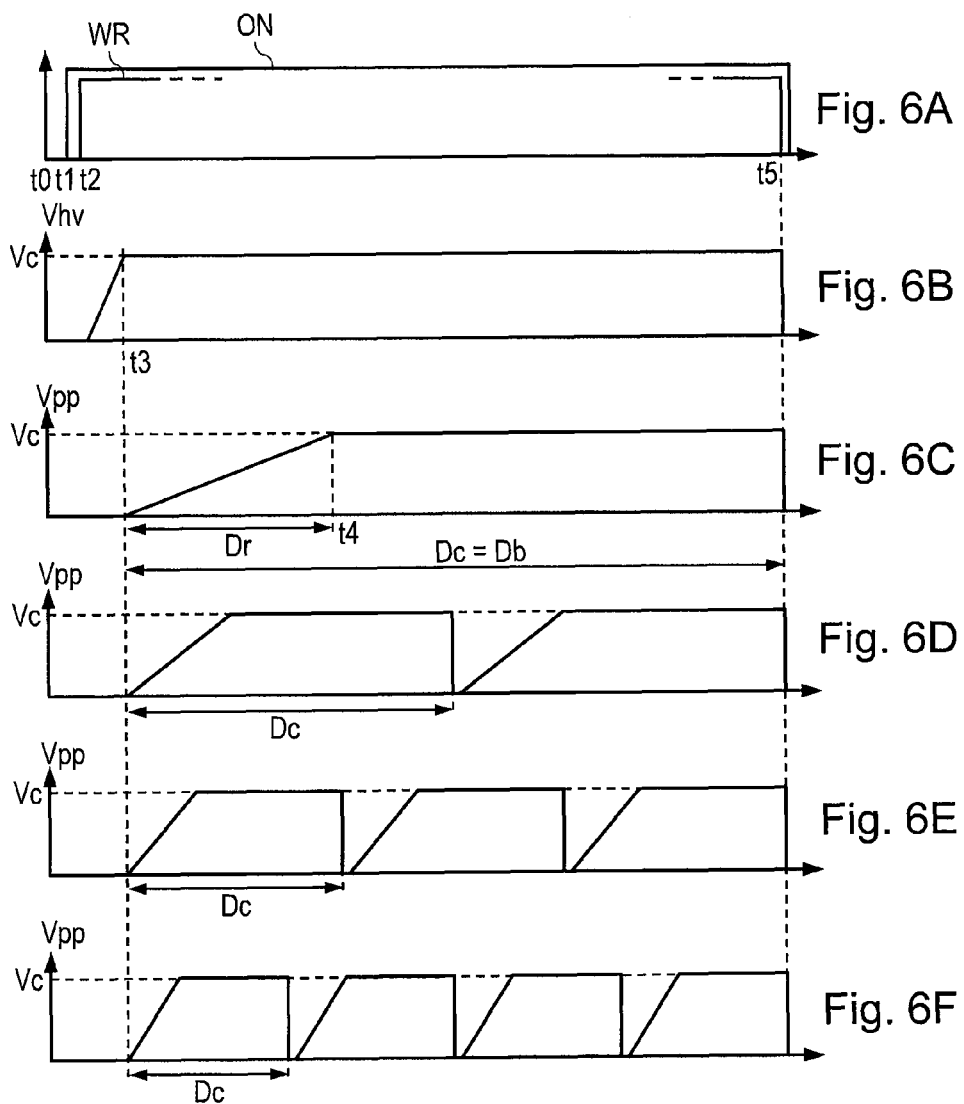

METHOD FOR BLOCK WRITING IN A MEMORY

TECHNICAL FIELD

The present disclosure generally relates to block writing in a non-volatile memory, of the Flash- or EEPROM-Electrically Erasable and Programmable Read Only Memory) type for example. The present disclosure relates more particularly but not exclusively to the writing of data in a memory of a passive-type contactless integrated circuit, electrically powered by a voltage produced using an antenna signal.

BACKGROUND INFORMATION

Contactless passive integrated circuits are generally intended for RFID (Radio Frequency IDentification) applications and can be of inductive coupling- or "electrical coupling"-type.

Passive integrated circuits of the first type comprise an antenna coil, send data by load modulation and are powered by inductive coupling in the presence of a magnetic field the frequency of which is generally in the order of approximately ten MHz. Such integrated circuits are for example described by the ISO/IEC 14443A/B and ISO/IEC 15693 standards that provide for a working frequency of 13.56 MHz.

Passive integrated circuits of the second type are electrically powered by a UHF electric field oscillating at several hundred MHz, and send data by modulating the reflectance rate of their antenna circuit (technique called "backscattering"). Such integrated circuits are for example described by the industrial specification EPCTM-GEN2 ("*Radio-Frequency Identity Protocols Class-1 Generation-2—UHF RFID Protocol for Communications at 860 MHz-960 MHz*") which is in the course of standardization. They are generally used in so-called "long range" applications, in which the distance between the integrated circuit and a data send/receive station sending the electrical field, commonly called reader, can reach several meters.

As these integrated circuits are passive, i.e., remotely electrically powered, their range directly depends on their power consumption. In other terms, the less energy they consume, the greater their range is. Therefore, it is useful to reduce their current consumption as far as possible. From this perspective, the memory of the integrated circuit is a considerable electrical energy consuming item.

One or more words can be block written either simultaneously or sequentially in an EEPROM-type memory for example. The memory cells of the memory are distributed along word lines and bit lines transversal to the word lines. To enable several words to be simultaneously written, each word line groups together the memory cells corresponding to the number of bits forming a word, multiplied by the maximum number of words capable of being programmed simultaneously. All of the words in a word line form a page. The memory cells are programmed using a programming latch connected to each bit line. As a result, the number of words capable of being programmed simultaneously is directly linked to the number of programming latches.

Now, the programming of the memory cells requires, in particular, a high voltage to be applied to the programming latches connected to the bit lines of the memory cells to be programmed. This high voltage is produced by a high voltage generator using the energy received by the integrated circuit. The energy received by the integrated circuit must therefore be sufficient to generate a high voltage capable of supplying all of the programming latches. Furthermore, the programming latches comprise high voltage transistors that contribute to increasing the active surface of the memory, this active surface having a direct impact on the power consumption. When they are not active, these high voltage transistors also have a considerable leakage rate that contributes to increasing the power consumption of the memory. As a result, the number of programming latches in a memory directly impacts the power consumption of the memory.

The result is that memories programmable by page of several words are little suited to contactless passive integrated circuits, particularly if it is desired to increase the range thereof.

Furthermore, the possibility of simulating a page-programming mode in a memory that is only word-programmable has already been considered. For this purpose, the words of the block to be written are stored in a buffer memory, and then written sequentially in the memory. For a block of several words to be written in the memory within a determined time, it is generally necessary to reduce the duration of the memory write cycle. Now, programming a memory cell needs a high voltage to be applied to the programming latches for a certain time which can only be reduced at the cost of decreasing the programming reliability. Furthermore, this high voltage should be applied gradually so as not to damage the floating-gate transistors of the memory cells.

BRIEF SUMMARY

One embodiment provides a method for block programming a non-volatile memory, in which the words of the block are written sequentially, without reducing the duration of a normal cycle of writing a word.

An embodiment provides a method for block writing in an electrically programmable non-volatile memory, a block to be written in the memory comprising at least one word, the method comprising sequentially writing each word of the block to be written in the memory.

According to one embodiment, the method comprises:
determining a word write time by dividing a fixed block write time by the number of words in the block to be written, and
controlling the memory to successively write each word in the memory during the write time.

According to one embodiment, the writing of each word in the memory comprises applying to the memory a high voltage required to write the word in the memory.

According to one embodiment, the writing of each word in the memory comprises applying a write voltage increasing gradually until it reaches a high voltage required to write the word in the memory.

According to one embodiment, the duration of the gradual increase of the write voltage applied to the memory until it reaches the high voltage, is proportional to the write time of each word.

According to one embodiment, the execution time of a command for writing a word in the memory is shorter than the execution time of a command for writing a block.

According to one embodiment, the memory is an EEPROM memory of a contactless passive integrated circuit.

One embodiment also relates to a contactless passive integrated circuit comprising an electrically programmable non-volatile data memory, and a processing unit designed to execute block writing commands, a block to be written comprising at least one binary word, each word of a block to be written being sequentially written in the memory.

According to an embodiment, the integrated circuit comprises:
means for determining a write time for writing each word of a block to be written, by dividing a fixed block write time by the number of words of the block to be written, and
control means for controlling the memory to control the writing of each word of a block to be written in the memory during the write time.

According to one embodiment, the integrated circuit comprises a booster circuit for supplying a high voltage required to write each word in the memory.

According to one embodiment, the integrated circuit comprises a circuit activated every time a word is written in the memory, to gradually increase a write voltage applied to the memory until it reaches a high voltage required to write a word in the memory.

According to one embodiment, the duration of the gradual increase of the write voltage applied to the memory until it reaches the high voltage, is proportional to the write time of each word.

According to one embodiment, the execution time of a command for writing a word in the memory is shorter than the execution time of a command for writing a block.

According to one embodiment, the memory is an EEPROM memory.

BRIEF DESCRIPTION OF THE SEVERAL VIEWS OF THE DRAWINGS

These and other features shall be presented in greater detail in the following description of one or more embodiments, given in relation with, but not limited to the following figures, in which:

FIGS. 6A to 6F are timing diagrams of electric signals showing the operation of the integrated circuit according to one embodiment.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
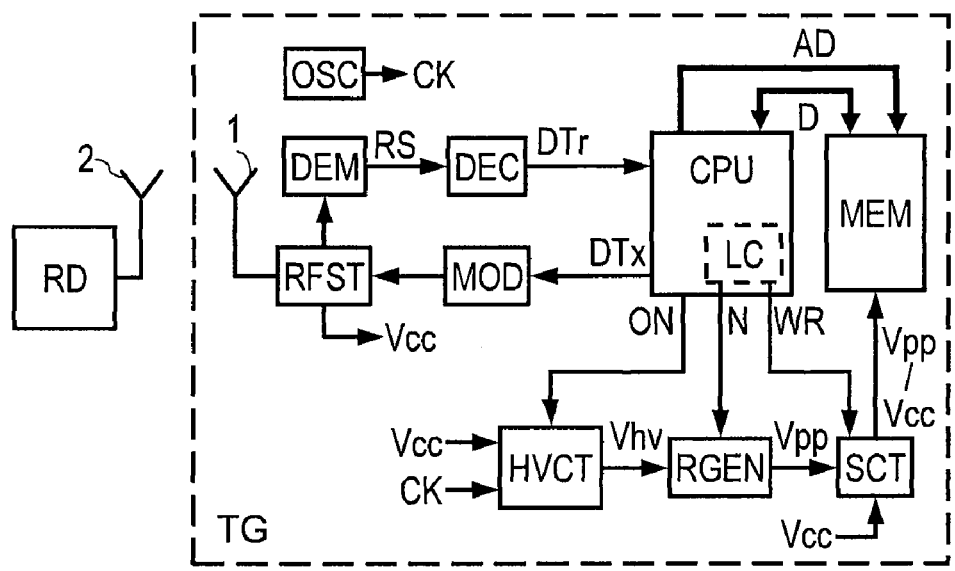
FIG. 1 schematically represents the architecture of a contactless integrated circuit according to one embodiment.

The embodiment of the integrated circuit TG represented in FIG. 1 comprises an antenna circuit 1, an electrical power supply circuit RFST, a demodulation circuit DEM, a decoding circuit DEC, a modulation circuit MOD, a central processing unit CPU, an EEPROM-type (electrically erasable and programmable) memory MEM, a booster circuit HVCT and an oscillator OSC which supplies a clock signal CK to the CPU.

In the presence of an electric field sent by a reader RD schematically represented, alternating antenna signals of low amplitude (a few tenths of Volts) appear on the conductor wires of the antenna circuit 1.

The circuit RFST supplies a voltage Vcc that powers the integrated circuit. The voltage Vcc is produced using the antenna signals. The circuit RFST is for example a primary charge pump that uses the alternating antenna signals as pumping signals. The voltage Vcc is typically in the order of one Volt to several Volts. The voltage Vcc produced is compatible with the technologies in microelectronics, whereby it is possible to produce small integrated circuits, implanted onto a silicon chip the surface area of which is less than one $mm^2$ and which operate with a supply voltage in the order of 1.8 V.

The modulation circuit MOD receives, from the central processing unit CPU, data DTx to be sent, generally in coded form, and modulates the impedance of the antenna circuit 1 according to these data, in this case by applying a modulation signal with an impedance S(DTx) to the circuit RFST, with the effect of short-circuiting stages of the primary charge pump.

The circuit DEM demodulates the antenna signals and supplies a demodulated signal RS. The decoding circuit DEC decodes the data received using the demodulated signal RS and supplies data DTr conveyed by these signals to the unit CPU. Such data are sent by the reader RD by modulating the electric field sent by the reader, for example by modulating the amplitude of the electric field.

The booster circuit HVCT comprises for example a charge pump and a circuit that excites the charge pump. The excitation circuit supplies the charge pump with two low frequency pumping signals in opposite phase, generated from the clock signal CK. The charge pump supplies a high voltage Vhv, typically from 10 to 15 V, using the voltage Vcc (or directly using the antenna signals). The voltage Vhv is applied to the memory MEM through a ramp generator RGEN and a selector switch SCT. The ramp generator RGEN enables the voltage Vhv to be gradually applied to the memory MEM during write phases, so as not to damage the memory cells. The high voltage supplied in ramp form to the output of the ramp generator RGEN is designated here by Vpp. The selector switch SCT applies either the voltage Vcc or the voltage Vpp to the memory MEM when the memory MEM is read- and respectively write-accessed.

The central processing unit CPU thus receives from the reader RD, through the antenna circuit 1 and the circuits RFST, DEM and DEC, commands for reading or writing the memory MEM, including a write or read address AD, the write commands further comprising data to be written D. It sends back messages that may contain data read in the memory, particularly in response to a read command.

The writing of a datum generally comprises the erasing of memory cells designated by the address received, corresponding to the writing of a "0" in the memory cells, and then the programming of the memory cells that must receive a "1".

When a write command is received, the unit CPU activates the circuit HVCT to generate the voltage Vhv. Then, the unit CPU applies the write address AD and the data to be written D to the memory, and then activates the switch circuit SCT so that a pulse of voltage Vpp having the duration of a write cycle is applied to the memory MEM. Here, the unit CPU activates the circuit HVCT by applying a signal "ON" equal to 1 to a control input of this circuit, and activates the switch circuit SCT by applying a signal "WR" equal to 1 to a control input of this circuit.

Figure 2:
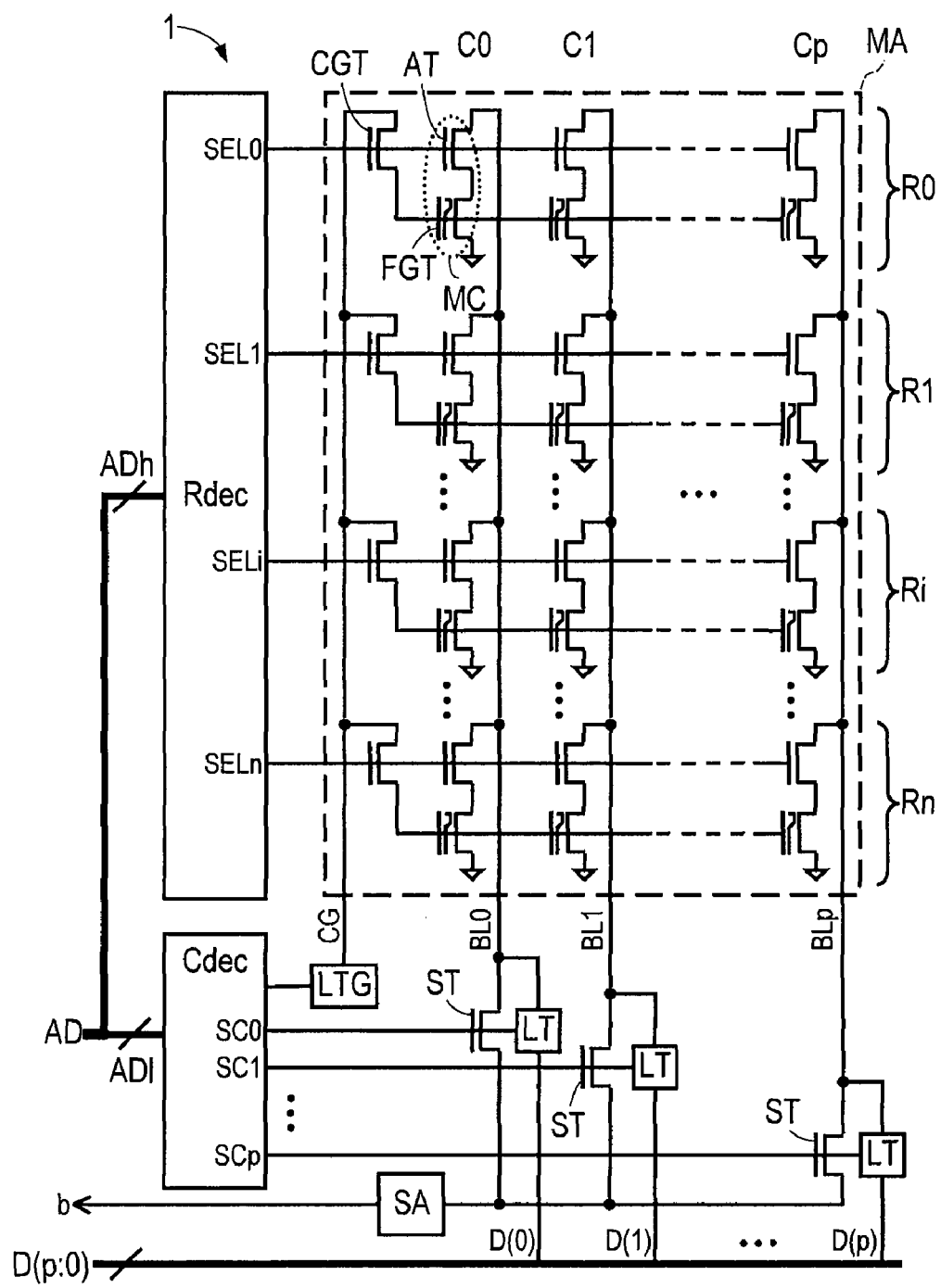
FIG. 2 shows an example of an embodiment of a non-volatile memory represented in block form in FIG. 1.

FIG. 2 represents an example of an embodiment of the memory MEM adapted to a contactless integrated circuit with a low power consumption. The memory MEM comprises a memory array MA, a line decoder RDEC, a column decoder CDEC, erasing and programming latches LT, LTG, selection transistors ST and a sense amplifier SA. The memory array MA comprises electrically erasable and programmable memory cells MC arranged according to horizontal and vertical lines and linked to word lines Ri (i being a whole number between 0 and n) and to bit lines BLj (j being a whole number between 0 and p). The erasing and programming latches LT and the transistors ST are linked to the bit lines of the memory array, and selected by a signal SCj supplied by the decoder CDEC and receive the bits D(j) of the data D(p:0) to be written in the memory array. The read circuit SA comprises a sense amplifier linked to the bit lines of the memory array MA through the selection transistors ST and supplying the bits b read in the memory array.

Each word line Ri comprises a selection line SELi connected to the line decoder RDEC and to the memory cells of the word line. Each word line further comprises a control gate transistor CGT the gate of which is controlled by the selection line SELi. A control gate line CG links the drain of the control gate transistors CGT to the output of a latch LTG controlled by the column decoder CDEC.

Each memory cell MC comprises an access transistor AT mounted in series with a floating-gate transistor FGT. The source of the transistor FGT is connected to the ground. The gate of the transistor AT is connected to the selection line SELi of the word line Ri to which the memory cell belongs. The gate of the transistors FGT of a word line Ri is connected to the source of the transistor CGT common to the memory cells of the word line. The drain of the transistor AT is connected to the bit line BLk of the bit column Ck.

The operation of such a memory cell is based on the tunnel effect (or Fowler Nordheim effect) and involves inducing displacements of the threshold voltage of the floating-gate transistor FGT by injecting or withdrawing charges from its floating gate through a thin oxide layer separating the floating gate from the doped silicon zone forming the transistor. An operation of erasing or programming a memory cell involves injecting or extracting electric charges by Fowler Nordheim effect in the floating gate of the transistor FGT. The transistor FGT has a threshold voltage VT1 (for example equal to approximately −2V) in the programmed state, and a threshold voltage VT2 (for example equal to about 4 V) in the erased state greater than the voltage VT1. When a read voltage Vread between VT1 and VT2 is applied through the transistor CGT to the control gate of the transistor FGT, the latter remains off if it is erased, which corresponds by convention to a logic "0", and is ON if it is programmed, which corresponds to a logic "1". It will be understood that a reverse convention can be chosen.

Figure 3:
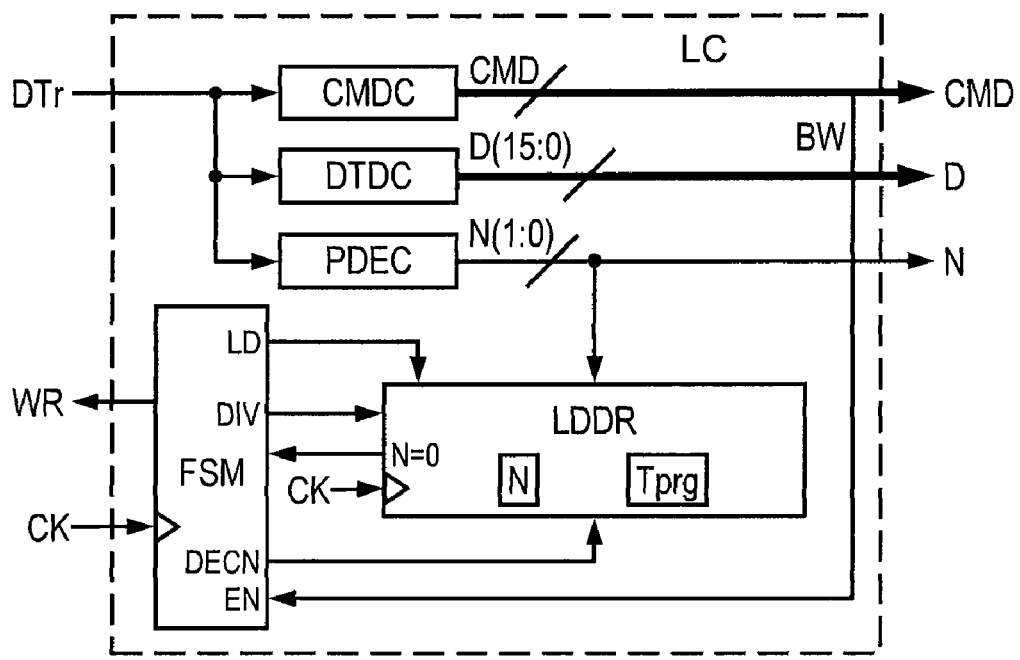
FIG. 3 represents in block form one embodiment of a logic circuit of the integrated circuit shown in FIG. 1.

FIG. 3 represents one embodiment of a circuit LC of the processing unit CPU, designed to receive and process the data DTr received. The circuit LG comprises three registers CMDC, DTDC, PDEC in which various fields of the data received are spread out. The register CMDC receives a command word CMD. The register DTDC receives one or more words to be written in the memory. The register PDEC receives a number N of data to be written in the event that the command CMD received is a block write command.

According to one embodiment, the circuit LC comprises a finite state machine FSM and a logic circuit LDDR for processing block write commands. The state machine FSM is paced by the clock signal CK and supplies the logic circuit LDDR with order signals for loading LD, dividing DIV and decrementing the number of data to be written N. The state machine FSM receives a signal indicating when the number N is on 0 from the logic circuit LDDR. The machine FSM is triggered by a signal BW sent by the register CMDC and indicating whether the command CMD is a block write command.

The logic circuit LDDR, also paced by the clock signal CK, loads the number N of the register PDEC after a loading order indicated by the signal LD.

Figure 4:
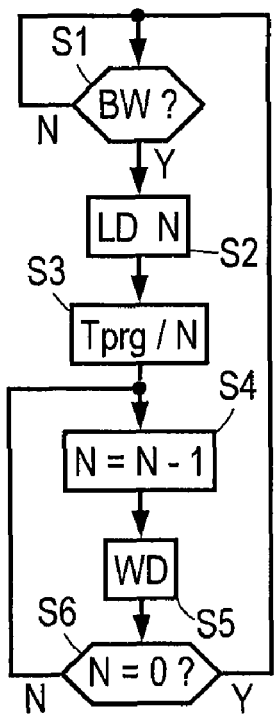
FIG. 4 is a flow chart describing operations performed by the logic circuit in FIG. 3 upon receiving a block-write command according to one embodiment.

The operation of the state machine FSM coupled to the logic circuit LDDR according to one embodiment is shown by the flowchart in FIG. 4. The processing performed by the state machine FSM is triggered by the detection signal BW for detecting a block write command. This processing involves calculating the duration of the read cycle by dividing a maximum duration Tprg of the read cycle by the number N of words in the block to be written, and then controlling the writing of each word in the block.

During the first step S1 of this processing, the state machine FSM seeks to detect a state change of the signal BW. If such a state change is detected, the state machine FSM sends the signal LD for the circuit LDDR to load the value N of the number of words to be written stored in the register PDEC (step S2). In the next step S3, the state machine FSM sends the signal DIV to order the circuit LDDR to divide the duration of the read cycle Tprg by the number N. In the next step S4, the number N is decremented by the circuit LDDR upon order DECN from the state machine FSM. In the next step S5, the state machine FSM sends the signal WR for triggering the writing of a word, this signal being applied to the selector switch SCT. In the next step S6, the state machine FSM tests whether the decremented value of N has reached the value 0. If the decremented value of N is not zero, the processing continues to the step S4 of decrementing N.

Figure 5:
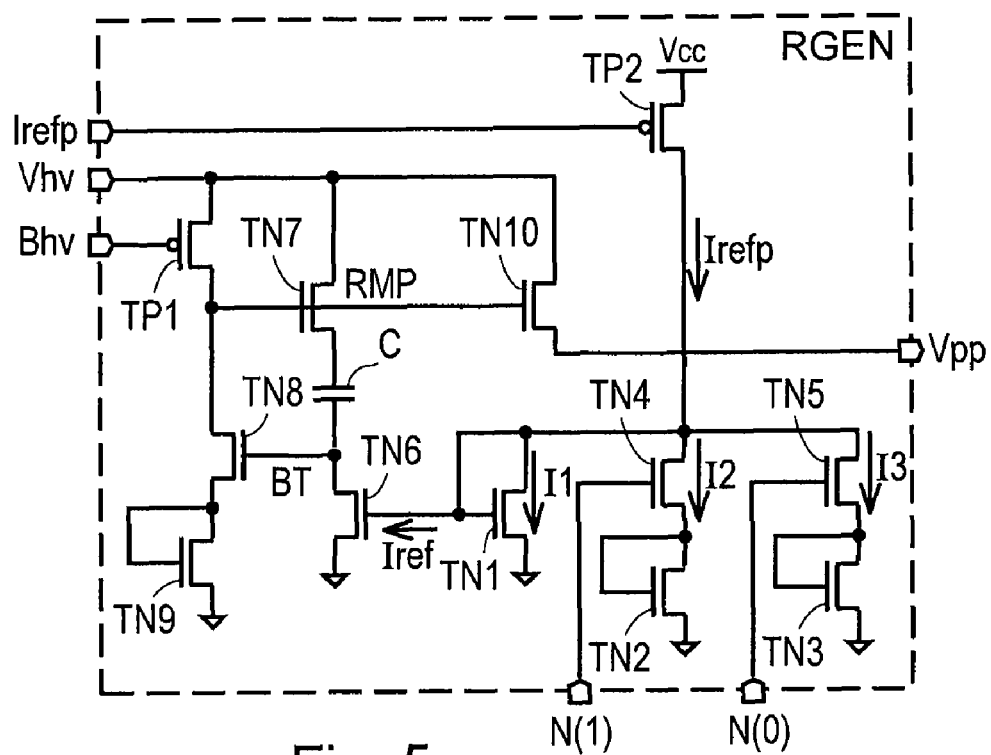
FIG. 5 is a wiring diagram of one embodiment of a ramp generating circuit represented in block form in FIG. 1.

FIG. 5 represents an example of a ramp generator circuit RGEN according to one embodiment when the maximum number of words in a block to be written is equal to 4. This circuit comprises three NMOS transistors TN1, TN2, TN3, each of these transistors having their source connected to the ground and their gate connected to their drain. The drain of each of the transistors TN2 and TN3 is further connected to the source of an NMOS transistor TN4, TN5. The gates of the two transistors TN4 and TN5 are controlled by the value of a bit N(0), N(1) of the number N of words in a block to be written in the memory MEM. The drains of the transistors TN1, TN4, TN5 are connected to the drain of a PMOS transistor TP2 the source of which receives the supply voltage Vcc and the gate of which receives a reference current Irefp.

The drains of the transistors TN1, TN4, TN5 are also connected to the gate of an NMOS transistor TN6 the source of which is connected to the ground and the drain of which is connected to a capacitor C and to the gate of an NMOS transistor TN8. The source of the transistor TN8 is connected to the drain and to the gate of an NMOS transistor TN9 the source of which is connected to the ground. The drain of the transistor TN8 is connected to the gates of NMOS transistors TN7 and TN10, and to the drain of a PMOS transistor TP1. The gate of the transistor TP1 is controlled by a bias voltage Bhv and the source of this transistor receives the high voltage Vhv. The drain of the transistor TN7 receives the high voltage Vhv and the source of this transistor is linked to the drain of the transistor TN6 through the capacitor C. The drain of the transistor TN10 receives the high voltage Vhv and the source of this transistor supplies the voltage Vpp.

Depending on the value of N, either one, the other or both of the transistors TN4 and TN5 are on. The result is that the current Iref flowing in the transistor TN6 is equal to the current I1 flowing in the transistor TN1, possibly adding the current I2 flowing in the transistors TN2, TN4, and/or the current I3 flowing in the transistors TN3, TN5. Table 1 below summarizes the values of the current Iref depending on the value of N:

TABLE 1

| N | N(0) | N(1) | Iref |
|---|------|------|------|
| 1 | 0 | 0 | I1 |
| 2 | 1 | 0 | I1 + I2 |
| 3 | 0 | 1 | I1 + I3 |
| 4 | 1 | 1 | I1 + I2 + I3 |

The assembly formed by the transistors TN6, TN7, TN8 and TN9 forms a current mirror in which the capacitor C is charged with constant current by the current Iref. Therefore, the charge slope of the capacitor C is constant and the duration of the capacitor charging is inversely proportional to the value of the current Iref.

The transistors TN2 and TN3 are designed for the current I2 passing through the transistor TN2 to be below the current I3 passing through the transistor TN3. In one embodiment, the transistors TN2 and TN3 are designed so that:

$I2 = I1$, and $I3 = I2 \cdot I1$.

Thus, the time for charging the capacitor C is equal to 1, ½, ⅓ and ¼ times a predefined time, when N is respectively equal to 1, 2, 3 and 4.

The voltage of the signal RAMP on the drain of the transistor TP1 increases with a constant slope starting from 0 as the capacitor C is charging. The result is that the voltage Vpp on the source of the transistor T10 increases from 0 V to reach the high voltage Vhv at the end of the capacitor charging.

If the maximum number of words in a block is greater than 4, it is sufficient to provide additional stages in parallel with the stages comprising the transistors TN2, TN4 on the one hand and TN3, TN5 on the other hand.

FIGS. 6A to 6F represent the appearance of the signals ON, WR, Vhv and Vpp. The signals ON and WR are represented in FIG. 6A, the voltage Vhv is represented in FIG. 6B. At an instant t0 before a first write cycle, the signals ON and WR are on 0 and the voltage Vhv is zero. At an instant t1, the unit CPU puts the signal ON to 1 and the voltage Vhv starts rising. At an instant t2, the unit CPU puts the signal WR to 1, but the selector switch circuit SCT remains off because the application of the signal WR to the control input of the circuit SCT is inhibited. At an instant t3, the voltage Vhv reaches a threshold value Vc. The circuit RGEN is triggered and a ramp of voltage Vpp is applied to the memory MEM. At an instant t4, the voltage Vpp reaches a plateau equal to Vc and remains stable in the vicinity of the plateau until an instant t5 that marks the end of the word write cycle. At the end of this cycle, the unit CPU puts the signal WR to 0 while leaving the signal ON on 1. At the end of the block write cycle, the unit CPU puts the signal ON to 0.

FIGS. 6C to 6F represent the appearance of the signal Vpp when the number N of words to be written is respectively equal to 1, 2, 3, and 4. FIGS. 6C to 6F show that the block write time Db=t5−t3 is constant whatever the number N of words in the block to be written. The duration of the word write cycle Dc being equal to the duration Db (FIG. 6C), divided by 2 (FIG. 6D), divided by 3 (FIG. 6E) and divided by 4 (FIG. 6F) if the number N of words in the block to be written is respectively equal to 1, 2, 3 and 4. FIGS. 6C to 6F also show that the ratio between the duration of the ramp Dr=t4−t3 and the duration of the word write cycle Dc is substantially constant when N varies.

Table 2 below groups together the values of the duration Dc of a word write cycle according to the number of words in the block to be written, when the duration of a block write cycle is set at 20 ms:

TABLE 2

| N | 1 | 2 | 3 | 4 |
|---|---|---|---|---|
| Dc (ms) | 20 | 10 | 6.6 | 5 |

In this example, the time interval between two consecutive block word write cycles is in the order of 50 μs.

The normal duration of a word write cycle is generally chosen so as to ensure sufficient write reliability. The duration of the ramp Dr is chosen so as to avoid damaging the floating-gate transistors, and in particular to limit the stress applied to the insulating layer of the floating gate.

In one embodiment, the duration of the word write cycle applied when executing a word write command is set at a value below the duration of the block write cycle. Thus, the execution time of a word write command is for example set at half the duration of the block write cycle. It is possible to write a single word using the block write command instead of the word write command. This choice enables improved write reliability to be achieved.

Various alternative embodiments are possible. Thus, when the memory needs to be powered by a high voltage during a write operation, it is not essential for this high voltage to follow a ramp to be applied gradually to the memory. The usefulness of such a ramp actually depends on the features of the memory. It is not essential either for the duration of this ramp to be inversely proportional to the number of words in the block to be written. The duration of this ramp can for example be chosen to be constant whatever the number of words in the block to be written.

Various applications of the embodiments are also possible and it is not solely intended for UHF contactless circuits operating by electrical coupling. One embodiment can particularly apply to inductive coupling integrated circuits and generally speaking to any integrated circuit or transponder comprising a non-volatile memory and the power consumption of which must be as low as possible. Furthermore, the embodiments do not apply solely to integrated circuits comprising an EEPROM memory. The embodiments can apply more generally to any integrated circuit comprising a non-volatile memory, for which it is desirable to reduce the power consumption while making the block writing operations more reliable.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method for block writing in an electrically programmable non-volatile memory, a block to be written in the memory having at least one word, the method comprising:
   determining a word write time by dividing a fixed block write time by a number of words in the block to be written; and
   sequentially writing each word of the block to be written in the memory;
   wherein the sequentially writing includes controlling the memory to successively write each word in the memory during the determined word write time.

2. The method according to claim 1 wherein the writing of each word in the memory includes applying to the memory a high voltage sufficient to write the word in the memory.

3. The method according to claim 1 wherein the writing of each word in the memory includes applying to the memory a write voltage that increases gradually until it reaches a high voltage sufficient to write the word in the memory.

4. The method according to claim 3 wherein a duration, of the gradual increase of the write voltage applied to the memory until it reaches the high voltage, is proportional to the write time of each word.

5. The method according to claim 1 wherein an execution time of a command to write a word in the memory is shorter than an execution time of a command to write the block.

6. The method according to claim 1 wherein the memory includes an EEPROM memory of a contactless passive integrated circuit.

7. The method of claim 1 further comprising:
   obtaining the number of words of the block to be written;
   storing the number of words of the block to be written; and
   decrementing said number as each word is written in the memory.

8. A contactless passive integrated circuit, comprising:
   an electrically programmable non-volatile data memory;
   a processing unit adapted to execute block writing commands, a block to be written having at least one binary word;
   means for determining a word write time to write each word of the block to be written, by dividing a fixed block write time by a number of words of the block to be written; and
   control means for controlling the memory, controlling writing of each word of the block to be written in the memory during the word write time, and causing the words of the block to be sequentially written in the memory.

9. The integrated circuit according to claim 8, further comprising a booster circuit adapted to supply a high voltage sufficient to write each word in the memory.

10. The integrated circuit according to claim 8, further comprising a circuit activated every time a word is written in the memory, and adapted to gradually increase a write voltage applied to the memory until it reaches a high voltage sufficient to write a word in the memory.

11. The integrated circuit according to claim 10 wherein a duration, of the gradual increase of the write voltage applied to the memory until it reaches the high voltage, is proportional to the write time of each word.

12. The integrated circuit according to claim 8 wherein an execution time of a command to write a word in the memory is shorter than an execution time of a command to write the block.

13. The integrated circuit according to claim 8 wherein the memory includes an EEPROM memory.

14. The integrated circuit of claim 8 wherein the processing unit includes at least one register adapted to store one or more of the block writing commands, a plurality of words to write in the memory including the at least one binary word, and said number of words of said block, and wherein the means for determining includes a finite state machine adapted to perform said dividing, to obtain a number of words of the block to be written and to decrement said number as each word is written in said memory, and wherein the processing unit includes a logic circuit coupled to said at least one register and to said finite state machine.

15. A method for writing a block in an electrically programmable non-volatile memory, said block to be written in the memory having a plurality of words, the method comprising:
   determining a word write time to respectively write each of said words, by dividing a block write time to write said block by a number of said words in said block; and
   sequentially writing each of said words in the memory, respectively during the word write time.

16. The method of claim 15 wherein said writing includes applying to the memory a voltage having a level sufficient to write the word in the memory.

17. The method of claim 15 wherein said writing includes applying to the memory a write voltage that ramps until reaching a voltage level sufficient to write the word in the memory.

18. The method of claim 17 wherein a duration of ramping of the write voltage is proportional to the write time.

19. The method of claim 15 wherein an execution time of a command to write a word in the memory is shorter than an execution time of a command to write the block.

20. An apparatus, comprising:
   a memory;
   a processor coupled to said memory and adapted to control sequential write of each of a plurality of words of a block in the memory during a respective word write time; and
   a circuit included with said processor and adapted to determine said word write time based on a division of a block write time to write said block in the memory by a number of said words of said block.

21. The apparatus of claim 20 wherein said memory includes an EEPROM memory of an integrated circuit of a contactless passive RFID device.

22. The apparatus of claim 20, further comprising a booster circuit coupled to said memory, and adapted to apply to said memory a voltage having a level sufficient to write each word in the memory.

23. The apparatus of claim 20 wherein said circuit includes:
- at least one register adapted to store a command to write in the memory, the plurality of words to write in the memory, and said number of words of said block;
- a finite state machine adapted to perform said division to obtain said number and to decrement said number as each word is written in said memory; and
- a logic circuit coupled to said at least one register and to said finite state machine, and adapted to process said command to write in the memory.

24. The apparatus of claim 20, further comprising a ramp generator circuit coupled to said memory, and adapted to be activated every time a word is to be written in the memory, and adapted to increase a write voltage applied to the memory until a voltage level is reached that is sufficient to write a word in the memory.

25. The apparatus of claim 24 wherein said ramp generator circuit includes a plurality of transistors coupled to form a current mirror.

26. The method of claim 15 further comprising:
- obtaining the number of said words in said block;
- storing the number of said words in said block; and
- decrementing said number as each of said words is written in the memory.

\* \* \* \* \*